United States Patent [19]
Anayama

[11] Patent Number: 5,862,166
[45] Date of Patent: Jan. 19, 1999

[54] SEMICONDUCTOR LASER WITH LIGHT EMITTING SLANT PLANE AND METHOD OF MANUFACTURING THE SAME

[75] Inventor: Chikashi Anayama, Kawasaki, Japan

[73] Assignee: Fujitsu Limited, Kawasaki, Japan

[21] Appl. No.: 659,830

[22] Filed: Jun. 7, 1996

[30] Foreign Application Priority Data

Jun. 26, 1995 [JP] Japan ................................ 7-159342

[51] Int. Cl.$^6$ ....................................................... H01S 3/18
[52] U.S. Cl. ................................ 372/43; 372/44; 257/13
[58] Field of Search ........................................ 372/43, 44

[56] References Cited

U.S. PATENT DOCUMENTS

| | | | |
|---|---|---|---|
| 4,984,242 | 1/1991 | Scifres et al. | 372/45 |
| 5,336,635 | 8/1994 | Anayama . | |
| 5,375,136 | 12/1994 | Anayama et al. | 372/46 |
| 5,436,194 | 7/1995 | Kondo et al. . | |
| 5,646,953 | 7/1997 | Naito et al. | 372/46 |

FOREIGN PATENT DOCUMENTS

| | | |
|---|---|---|
| 6-45708 | 2/1994 | Japan . |
| 7-66495 | 3/1995 | Japan . |
| 7-202314 | 8/1995 | Japan . |
| 7-202315 | 8/1995 | Japan . |
| 7-263805 | 10/1995 | Japan . |

OTHER PUBLICATIONS

Extended Abstract, Aug. 1992 Intern'l Conference on Solid State Devices and Materials, pp. 619–621, "One–Step MOVPE–Grown Index–Guide GaInP/AlGaInP Visible Laser Using Simultaneous Impurity Doping" C. Anayama et al., Fujitsu Laboratories, Ltd.

Applied Physics Letters, vol. 63, No. 13, Sep. 27, 1993; pp. 1736–1738 "One–Step–Vapor–Phase–Epitaxy–Grown AlGaInP Visible Laser Using Simultaneous Impurity Doping", C. Anayama et al.; Fujitsu Laboratories, Ltd.

Electronics Letters, vol. 30, No. 7, pp. 565–566, Mar. 31, 1994; "Alternate Doping of p–type and n–type Impurities for AlGaInP Selfaligned Stepped Substrate (S$^3$) Lasers".

*Primary Examiner*—Olik Chaudhuri
*Assistant Examiner*—Douglas A. Loille
*Attorney, Agent, or Firm*—Armstrong, Westerman, Hattori, McLeland & Naughton

[57] ABSTRACT

A semiconductor laser having a stepped substrate of group III-V compound semiconductor exposing upper and lower flat planes and a slant plane coupling the upper and lower flat planes, a lower clad layer formed directly on the stepped substrate, an active layer formed directly on the lower clad layer, and an upper clad layer formed directly on the active layer and including a current blocking layer at partial first depth regions. Denoting an angle between a boundary plane, between a region in the upper clad layer along the upper flat plane and a region in the upper clad layer along the slant plane, and the slant plane of the active layer, or an angle between a first virtual plane and the slant plane of the active layer, the first virtual plane being made by extending a boundary plane, between a region in the lower clad layer along the upper flat plane and a region in the lower clad layer along the slant plane, into the upper clad layer, θ, the angle θ at the partial first depth region, on the active layer side, for one of the upper and lower clad layers is different from the angle θ for the one clad layer at a second depth region more remote from the active layer than the first depth region.

17 Claims, 13 Drawing Sheets

SEMICONDUCTOR LASER WITH LIGHT EMITTING SLANT PLANE AND METHOD OF MANUFACTURING THE SAME

BACKGROUND OF THE INVENTION a) Field of the Invention

The present invention relates to a semiconductor laser, and more particularly to a semiconductor laser with a light emitting slant plane and without a buried mesa structure.

b) Description of the Related Art

Visible light semiconductor lasers of a 0.6 µm band have recently been regarded as a promising light source capable of improving the performance of optical information processing systems such as point of sales (POS) systems, optical disk drives, and laser printers.

Conventional typical semiconductor lasers use a buried mesa structure. Specifically, an epitaxially laminated structure including an active layer is mesa-etched to define the lateral width of the active layer, and thereafter the mesa structure is buried with material of a low refractive index.

AlGaInP based semiconductor lasers have been expected to be used for visible light semiconductor lasers of the 0.6 µm band. AlGaInP material is required to be grown by metal organic vapor phase epitaxy (MOVPE) or molecular beam epitaxy (MBE) because of the necessity of controlling composition of Al. With these growth methods, it is very difficult to grow a layer containing Al on an underlie layer containing Al because it is difficult to avoid surface oxidation. It is therefore difficult to obtain a refractive index distribution suitable for lateral mode control by burying the mesa structure with material containing Al.

Low cost, low threshold current, and high power are required for visible light semiconductor lasers of the 0.6 µm band. High and stable beam characteristics are also desired, for example, a high kink level, a high quantum efficiency, a low power consumption, far and near field patterns with a single peak, and low beam astigmatism.

If a semiconductor laser can be manufactured by a series of MOVPE processes, an AlGaInP based semiconductor laser can be manufactured at low cost.

Various proposals of forming a laser structure by a series of growth processes have been proposed.

SUMMARY OF THE INVENTION

It is an object of the present invention to provide a semiconductor laser capable of being manufactured by a series of MOVPE processes.

According to one aspect of the present invention, there is provided a semiconductor laser comprising: a stepped substrate of group III-V compound semiconductor exposing on a surface thereof upper and lower flat planes having a (1 0 0) plane or (n 1 1) A plane (n being a real number, 7<n) and a slant plane having an (m 1 1) A plane (m being a real number, 2≦m≦7), the slant plane coupling the upper and lower flat planes; a lower clad layer of group III-V compound semiconductor formed on the surface of the stepped substrate; an active layer directly formed on the lower clad layer, the active layer having two flat planes exposing the (1 0 0) plane or (n 1 1) A plane (n being a real number, 7<n) and a slant plane exposing a (k 1 1) A plane (k being a real number, 3≦k≦7), the slant plane coupling the two flat planes; and an upper clad layer of group III-V compound semiconductor directly formed on the active layer, the upper clad layer including a current blocking layer formed in regions along the flat plane at a certain depth, wherein assuming an angle θ is an angle between a boundary plane, between a region in the upper clad layer along the upper flat plane and a region in the upper clad layer along the slant plane, and the slant plane of the active layer, or an angle between a first virtual plane and the slant plane of said active layer, the first virtual plane being made by extending a boundary plane, between a region in the lower clad layer along the upper flat plane and a region in the lower clad layer along the slant plane, into the upper clad layer, the angle θ at least at a partial first depth region, on the active layer side, in one of the upper and lower clad layers is different from the angle θ at a second depth region in the one clad layer and more remote from the active layer than the first depth region.

The area of light emission distribution of a semiconductor laser with a light emitting slant plane is ellipsoidal having a longer axis generally parallel to the slant plane of the active layer. The polarization direction of a laser beam changes with the angle θ defined by the boundary plane at the first depth region. By properly setting this angle θ, the polarization direction can be set to a desired direction.

If the angle θ is shifted from 90 degrees, carriers are injected concentratedly into the upper or lower area of the slant portion of the active layer. With this concentration, carriers radiate light at the stable area. If the angle θ at the second depth region in the clad layer is made different from the angle θ at the first depth region and properly set, the radiative area can be stabilized.

According to another aspect of the present invention, there is provided a semiconductor laser wherein the angle θ at the first depth region is generally 90 degrees.

By setting the angle θ at the first depth region to generally 90 degrees, the polarization direction can be set near along the direction of the slant plane of the active layer.

According to another aspect of the present invention, there is provided a method of manufacturing a semiconductor laser comprising the steps of: preparing a stepped substrate of group III-V compound semiconductor exposing on a surface thereof upper and lower flat planes having a (1 0 0) plane or (n 1 1) A plane (n being a real number, 7<n) and a slant plane having an (m 1 1) A plane (m being a real number, 2≦m≦7), the slant plane coupling the upper and lower flat planes; forming a lower clad layer of group III-V compound semiconductor formed on the surface of the stepped substrate, through metal organic vapor phase epitaxy; forming an active layer directly on the lower clad layer, the active layer having two flat planes exposing the (1 0 0) plane or (n 1 1) A plane (n being a real number, 7<n) and a slant plane exposing a (k 1 1) A plane (k being a real number, 3≦k≦7), the slant plane coupling the two flat planes; and forming an upper clad layer of group III-V compound semiconductor directly on the active layer through metal organic vapor phase epitaxy, the upper clad layer including a current blocking layer formed in regions along the flat plane at a certain depth, wherein at least one of the lower clad layer forming step and the upper clad layer forming step comprises: a first step of growing group III-V compound semiconductor by supplying source gases at a first V/III ratio; and a second step of growing group III-V compound semiconductor by supplying source gases at a second V/III ratio different from the first V/III ratio.

The angle between the boundary plane between the region along the flat plane and the region along the slant plane respectively of the upper or lower clad layer, and the slant plane of the active layer, can be controlled by changing the V/III ratios when group III-V compound semiconductor layers are grown.

According to another aspect of the present invention, there is provided a semiconductor laser comprising: a stepped substrate of group III-V compound semiconductor exposing on a surface thereof upper and lower flat planes having a (1 0 0) plane or (n 1 1) A plane (n being a real number, 7<n) and a slant plane having an (m 1 1) A plane (m being a real number, 2≦m≦7), the slant plane coupling the upper and lower flat planes; a lower clad layer of group III-V compound semiconductor formed on the surface of the stepped substrate; an active layer directly formed on the lower clad layer, the active layer having two flat planes exposing the (1 0 0) plane or (n 1 1) A plane (n being a real number, 7<n) and a slant plane exposing a (k 1 1) A plane (k being a real number, 3≦k≦7), the slant plane coupling the two flat planes; and an upper clad layer of group III-V compound semiconductor directly formed on the active layer, the upper clad layer including a current blocking layer formed in regions along the flat plane at a certain depth, wherein at least one of the upper and lower clad layers includes a strain layer disposed in parallel to the active layer, the strain layer containing strains.

By inserting the strain layer in parallel to the active layer, an off-angle of the polarization direction from the longer axis direction of the ellipsoidal area of light emission distribution can be made small.

As described above, a semiconductor laser with a light emitting slant plane can be provided which has a relatively small off-angle of the polarization direction from the direction of the slant plane of the active layer, while retaining a stable radiative area.

DETAILED DESCRIPTION OF THE PREFERRED EMBODIMENTS

The proposal previously made by the present inventor and his colleague will be first described in order to help understand the present invention.

Figure 1:
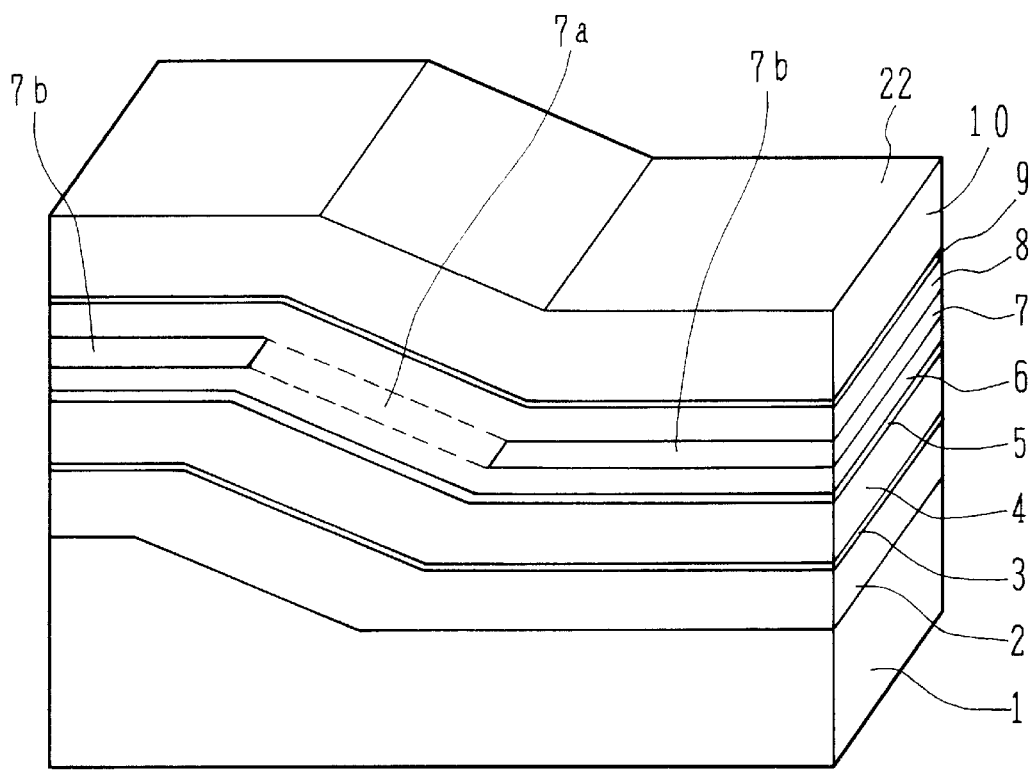
FIG. 1 is a perspective view of a semiconductor laser previously proposed by the present inventor and his colleague.

FIG. 1 shows a semiconductor laser with a light emitting slant plane previously proposed by the present inventor and his colleague (U.S. Pat. No. 5,436,194 and U.S. patent application Ser. No. 08/427,352, which are incorporated herein by reference). An n-type GaAs substrate 1 has a (1 0 0) principal plane, and its slant plane portion has, for example, a (3 1 1) plane. On the GaAs substrate 1, an n-type GaAs buffer layer 2, an n-type GaInP intermediate layer 3, and an n-type AlGaInP clad layer 4 are formed in this order from the bottom. The GaInP intermediate layer 3 has a bandgap intermediate between the GaAs buffer layer 2 and AlGaInP clad layer 4 to relax potential barriers at heterojunctions.

On the n-type AlGaInP clad layer 4, a multi quantum well (MQW) active layer 5 is formed. The active layer 5 is an undoped layer and has flat plane portions and a slant plane portion conformal to the shape of the underlie layer. The active layer 5 is covered with a laminate structure of AlGaInP clad layers 6, 7, and 8. As current passes through the slant plane portion of the active layer, radiative recombination occurs and light is emitted. Even if the light propagates in the slant direction to enter the upper and lower clad layers, the clad layers have a refractive index lower than the active layer so that the laser light distribution is limited only in the slant plane portion in the lateral direction. In this manner, light confinement in the lateral direction is achieved.

Figure 2:
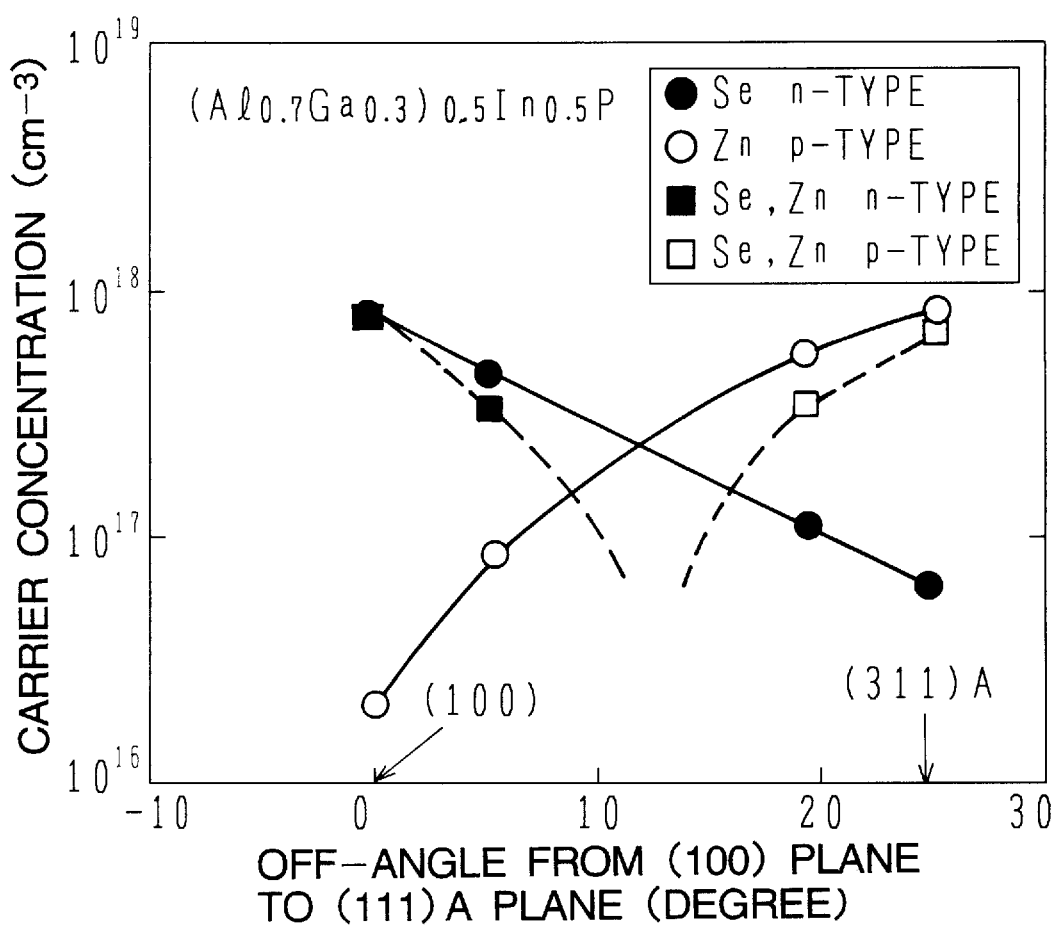
FIG. 2 is a graph showing a dependency of a doping amount upon crystal orientation.

An AlGaInP layer 7 is formed on the first p-type clad layer 6, the AlGaInP layer 7 having an n- and p-type regions doped with Se and Zn. As indicated by black circles in FIG. 2, n-type impurities Se are heavily doped in the (1 0 0) plane region, and less doped toward the (3 1 1) A plane region, and as indicated by white circles, p-type impurities Zn are heavily doped at the (3 1 1) A plane, and less doped toward the (1 0 0) plane region. Therefore, in the AlGaInP layer 7 doped with Se and Zn, the amount of doped impurities changes with crystal orientation, and the carrier concentrations indicated at black and white squares are eventually obtained. The region at the (1 0 0) flat plane is an n-type, and the region near the (3 1 1) A plane is a p-type.

As shown in FIG. 1, the AlGaInP layer 7 therefore has a p-type second clad layer 7a at the slant plane portion and an n-type current block layers 7b at the flat plane portions.

On the AlGaInP layer 7, a p-type AlGaInP third clad layer 8, a p-type GaInP intermediate layer 9, and a p-type GaAs contact layer 10 are stacked in this order.

The laminate from the buffer layer 2 to the contact layer 10 is formed by a series of MOVPE processes to manufacture a semiconductor laser of the 0.6 µm band.

Although a semiconductor laser having a light emitting slant plane has low astigmatism, if the width of the slant plane is set to about 3 μm, light is hard to emit at the whole region of the slant plane. Instead, it radiates at the upper or lower area of the slant plane, and light distribution localized at the upper area transits to the lower area or vice versa. The radiative area is therefore unstable.

The reasons of forming unstable radiative areas will be discussed.

Figure 3A:
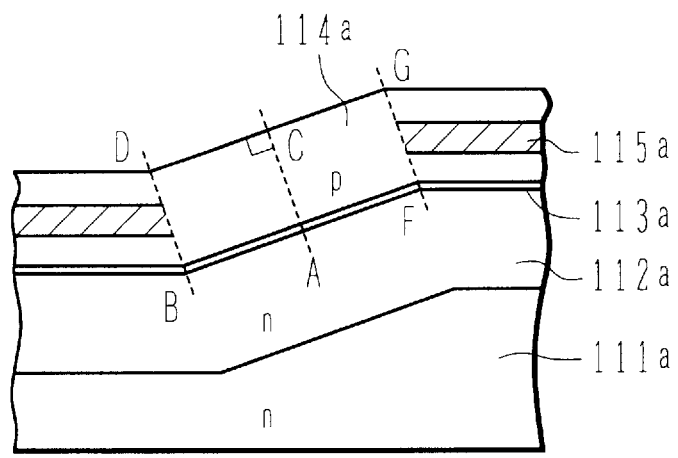
FIGS. 3A and 3B are schematic cross sectional views of a semiconductor laser with a light emitting slant plane, illustrating a stability analysis of a light emission region.

As shown in FIG. 3A, it is assumed that an n-type semiconductor substrate 111a has flat plane portions and a slant plane portion, and on the substrate 111a an n-type lower clad layer 112a, an active layer 113a, and a p-type upper clad layer 114a are formed.

The boundaries between the flat plane portions and the slant plane portion of the p-type upper clad layer 114a gradually move toward the left as the layer 114a is grown. In each of the flat plane portions of the p-type upper clad layer 114a, an n-type current blocking layer 115a is formed at the intermediate position, in the vertical direction, of the clad layer 114a because of a difference in the doping or incorporating probability between p- and n-type impurities.

Therefore, carriers entering a slant plane segment BF of the active layer 113a can be considered to be incident thereto from a slant plane segment DG of the upper plane of the upper clad layer 114a. If a foot E of a perpendicular drawn from the middle point C of the segment DG onto the slant plane portion of the active layer 113a coincides with the middle point A of the slant plane segment BF, then a probability of light emission in the upper half portion AF is equal to a probability of light emission in the lower half portion BA.

If a carrier supply source does not distribute uniformly over the slant portion segment DG but is biased either to the right or left half of the segment DG, a probability of light emission at the right or left half slant portion BF increases. This may be the reason of forming unstable radiative areas.

Figure 3B:
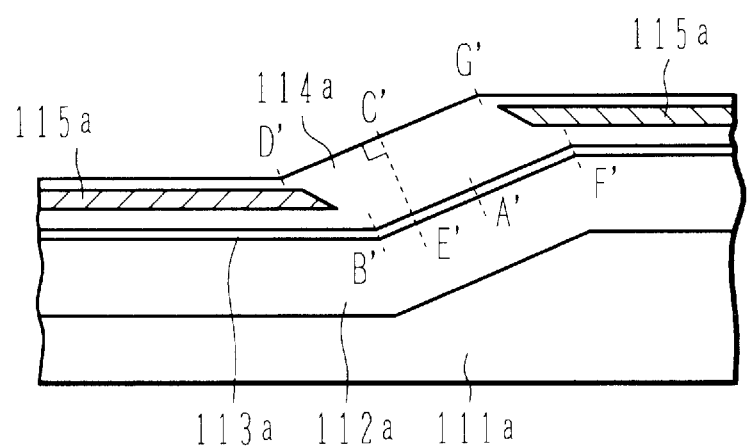

FIG. 3B is a schematic diagram showing the structure of a semiconductor laser with a stabilized radiative area disclosed by the present inventor and his colleagues in the patent application (Japanese Patent Laid-open Publication No. Hei 7-66495). This structure is shown in U.S. application Ser. No. 08/275,427, the disclosure of which is hereby incorporated by reference. On the surface of a semiconductor substrate 111a having a striped slant plane portion, a lower clad layer 112a, an active layer 113a, and an upper clad layer 114a are sequentially and epitaxially grown. In the upper clad layer 114a, current blocking layers 115a of an opposite conductivity type are formed at the flat plane portions. Carriers are considered to substantially flow from the upper side of the active region into the intermediate region between the current blocking layers 115a, this region being defined by B', F', G', and D'.

If the epitaxial growth speed is faster at the slant plane portion than at the flat plane portion, a foot E' of a perpendicular drawn from the middle point C' of the slant plane segment D'G' of the epitaxial layer intersects with a point lower than the middle point A' of the slant portion segment B'F'. In this case, carriers entered from the upper side of the active region concentrate to the lower portion of the slant plane portion which becomes a stable radiative area.

In order to obtain a laminate structure having a cross section shown in FIG. 3B, a ratio of a thickness (or growth speed) of the clad layer at the slant plane portion to a thickness (or growth speed) at the flat plane portions is properly selected.

Figure 4:
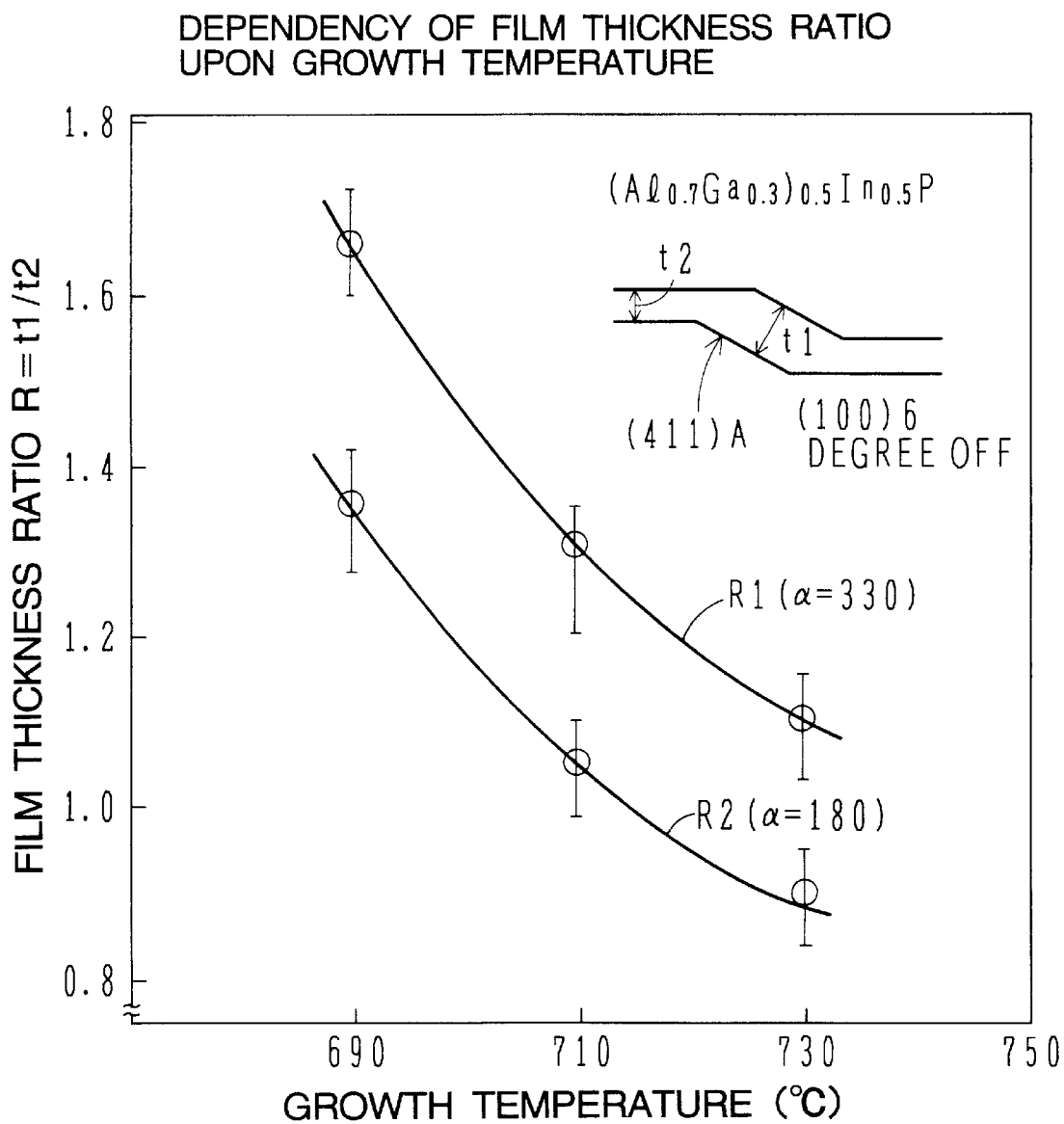
FIG. 4 is a graph showing a dependency of a film thickness ratio between regions grown on a stepped substrate upon a growth temperature.

FIG. 4 is a graph showing a dependency of a film thickness ratio (at slant and flat plane portions) upon a growth temperature of $(Al_{0.7}Ga_{0.3})_{0.5}In_{0.5}P$. The ordinate represents a ratio R=t1/t2, and the abscissa represents a growth temperature °C., where t1 is a thickness at the flat plane portion and t2 is a thickness at the slant plane portion.

A curve R1 stands for a V/III ratio α of 300, and a curve R2 stands for a V/III ratio α of 180. The flat plane portion has a plane with an off-angle 6° from the (1 0 0) plane, and the slant plane portion has the (4 1 1) A plane.

As shown in FIG. 4, the film thickness ratio R lowers as the temperature rises. At the V/III ratio α of 180, the film thickness ratio is 1 or higher at the temperature lower than about 715° C., and 1 or lower at the higher temperature. At the V/III ratio α of 330, the film thickness ratio is larger than 1 in the temperature range from 690° to 730° C., and lowers from about 1.7 to about 1.1 as the temperature rises.

By properly selecting a growth temperature or V/III ratio, a desired film thickness ratio R can be obtained.

The far field pattern of the semiconductor laser shown in FIG. 3A or 3B has a single peak. However, the near field pattern has double peaks or is asymmetric, in some cases. The present inventor and his colleagues has proposed in the disclosure of Japanese Patent Laid-open Publication No. Hei 7-202314 to obtain a near field pattern with a single peak by setting an angle between a linear extension of the flat plane and the slant plane of the active region 113 to 120 or smaller, or setting the width of the slant plane segment BF or B'F' of the active region 113 to 2.5 μm or narrower.

Figure 5:
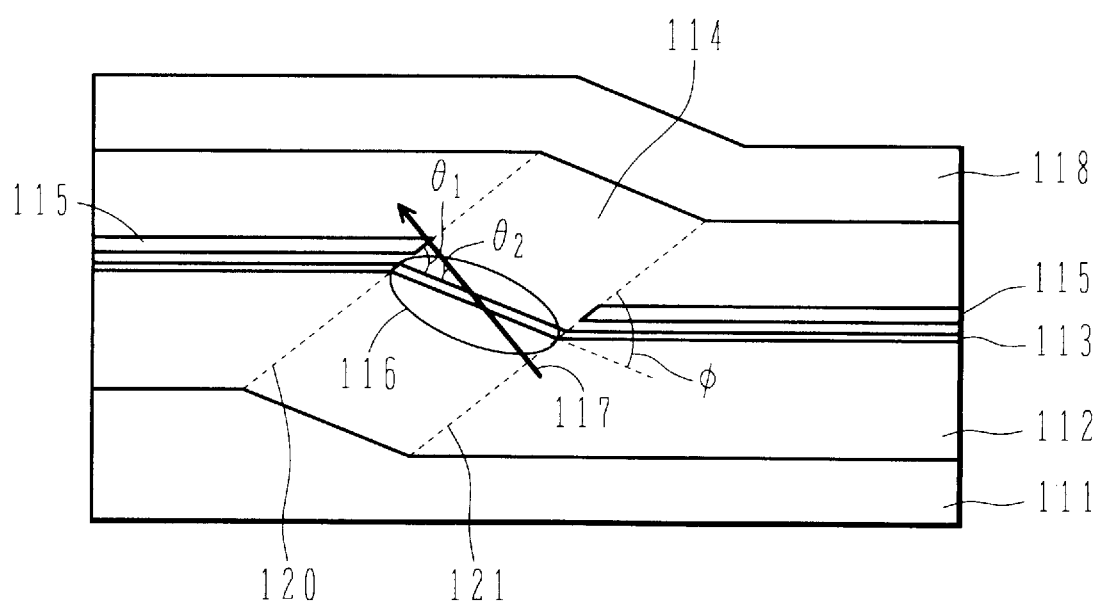
FIG. 5 is a cross sectional view of a semiconductor laser with a light emitting slant plane, illustrating a light intensity distribution and a polarization direction.

A semiconductor laser having a stable radiative area and a near field pattern with a single peak can thus be formed. From the studies of light emission characteristics of the semiconductor laser having the structure shown in FIG. 3B, it was found that the electric vector direction (polarization direction) of a laser beam was not parallel to the active region, but there was some slant angle therebetween. FIG. 5 illustrates a light distribution and a polarization direction of a laser with a light emitting slant plane. On the surface of a semiconductor substrate 111 with a striped slant plane portion, a lower clad layer 112, an active layer 113, an upper clad layer 114, and a contact layer 118 are sequentially and epitaxially formed. In the upper clad layer 114, current blocking layers 115 of an opposite conductivity type are formed in the flat plane portions at the intermediate position in a depth direction.

Laser beams distribute in an ellipse area 116 near the slant plane portion of the active layer 113. The longer axis of the ellipse area 116 is parallel to the active layer 113. However, the polarization direction of the laser beam is inclined by an angle $\theta_2$ relative to the slant plane of the active layer, as indicated by an arrow 117. The polarization direction of a laser beam is therefore rotated from the longer axis of the ellipse area 116. Such a laser is not suitable for a light source of an apparatus such as a magneto-optical disk drive which utilizes rotation of a polarization direction of a laser beam. It is desired that the longer axis of the ellipse area of light intensity distribution is coincident with the polarization direction.

The inventor has found that the angle $\theta_2$ between the polarization direction and the slant plane of the active layer depends on an angle $\theta_1$ between the boundary plane, between the slant plane portion and the upper flat plane portion, and the slant plane of the active layer.

Figure 6:
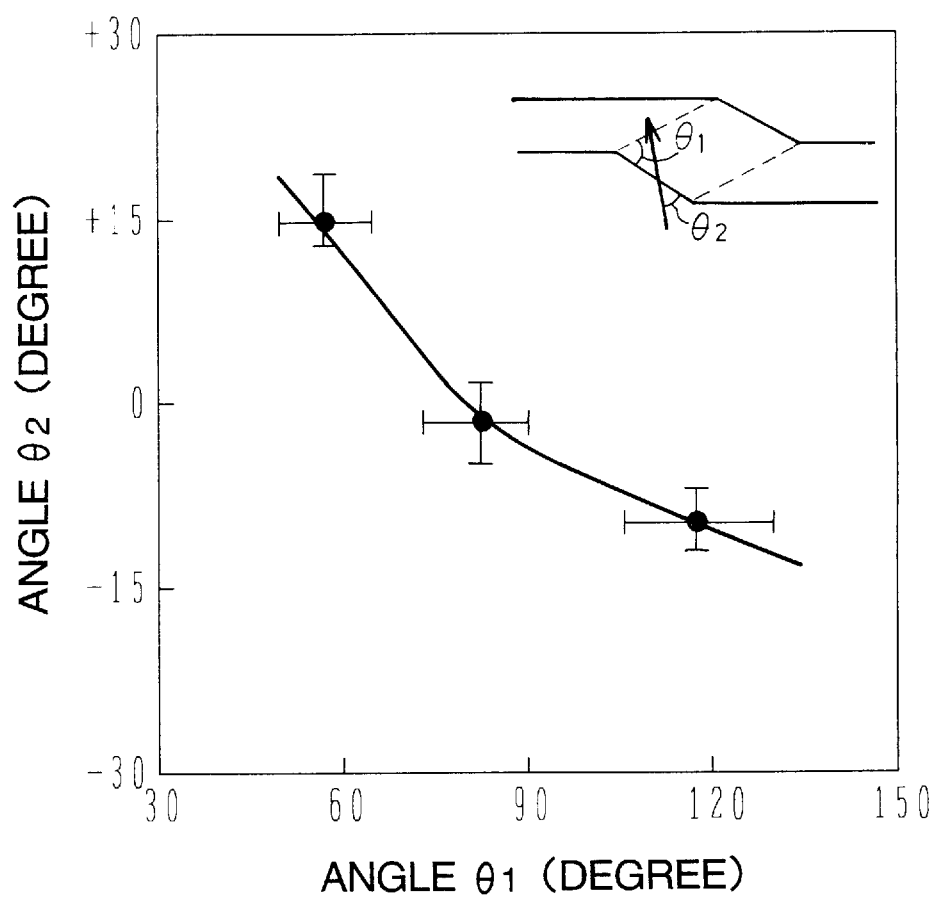
FIG. 6 is a graph showing a relationship between angles $\theta_1$ and $\theta_2$ where $\theta_1$ is an angle between a boundary plane, between a flat plane portion and a slant plane portion of a semiconductor laser with a light emitting slant plane, and the slant plane, and $\theta_2$ is an angle between a polarization direction and the slant plane.

FIG. 6 is a graph showing a dependency of the angle $\theta_2$ between the polarization direction and the slant plane of the active layer upon the angle $\theta_1$. The abscissa represents the angle $\theta_1$ (degree) between the boundary plane, between the slant plane portion and the upper flat plane portion, and the slant plane of the active layer. The ordinate represents the angle $\theta_2$ (degree) between the polarization direction and the slant plane of the active layer.

At the angle $\theta_1$ of 60 degrees, the angle $\theta_2$ is about +15 degrees. As the angle $\theta_1$ increases, the angle $\theta_2$ decreases. At the angle $\theta_1$ of about 90 degrees, the angle $\theta_2$ is about 0 degree, i.e., the polarization direction is generally parallel to the slant plane portion of the active layer.

In FIGS. 5 and 6, the angle between the boundary plane, between the slant plane portion and the upper flat plane portion, and the slant plane of the active layer is used in the above description. There are two boundary planes 120 and 121 in FIG. 5. Only one boundary plane may be used if the two boundary planes between the slant plane portion and flat plane portions are parallel. However, strictly speaking, these two boundary planes are not parallel. In some cases, the angle $\theta_1$ between the boundary plane, between the slant plane portion and the upper flat plane portion, and the slant plane differs by 20 degrees or more from the angle $\phi$ between the boundary plane, between the slant plane portion and the lower flat plane portion, and a virtual plane made by linearly extending the slant plane to the lower flat plane. The angle $\phi$ shown in FIG. 5 is equal to the angle between a virtual plane which is made by extending a boundary plane, between the slant plane portion and the lower flat plane portion, into the lower clad layer 112, and the slant plane. In such cases, an angle $\theta_1$ or $\phi$ is set to about 90 degrees, or an average of the two angles $\theta_1$ and $\phi$ is set to about 90 degrees.

As described with FIG. 6, if the angle between the boundary plane and the slant plane is set to about 90 degrees, the angle between the polarization direction and the active layer slant plane can be made small. However, with the angle of 90 degrees between the boundary plane and the slant plane, radiative areas become unstable or the single peak of the near field pattern is degraded, as discussed with FIG. 3A. Still further, the number of pit defects of about 1 $\mu$m diameter on the GaAs contact layer 10 shown in FIG. 1 increases. These pit defects shorten the lifetime of a laser.

Figure 7:
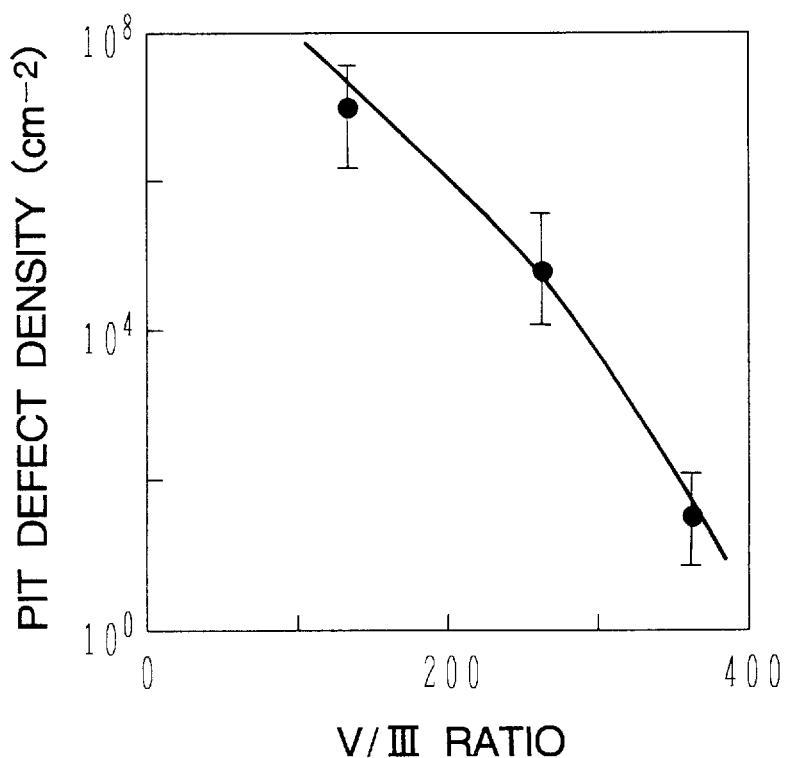
FIG. 7 is a graph showing a dependency of a pit defect density on the surface of a GaAs layer grown on a stepped substrate, upon a V/III ratio.

FIG. 7 is a graph showing a relationship between a pit defect density and a V/III ratio of a clad layer grown under the GaAs contact layer. The abscissa represents a V/III ratio, and the ordinate represents a pit defect density in the unit of $cm^{-2}$.

The pit defect density is about $10^7 cm^{-2}$ at a V/III ratio of about 130, and lowers as the V/III ratio is reduced. At the V/III ratio of 250 or higher, the pit defect density becomes $10^5 cm^{-2}$ or lower. Therefore, if an AlGaInP clad layer is grown at a V/III ratio of 250 or higher before the GaAs contact layer is grown, an increase of pit defects can be suppressed.

The inventor has also found that unstable radiative areas and degradation of a single peak of the near field pattern can be solved, by setting the angle between the slant plane and boundary planes to about 90 degrees only near at the active layer, and by making the film thickness at the slant plane portion thicker than that at the flat plane portions. The reason of this can be ascribed to that the polarization direction is mainly determined by the layer structure near the active layer and that radiative areas and near field pattern are influenced not only by the layer structure near the active layer but also by the layer structure in the wider range.

Figure 8A:
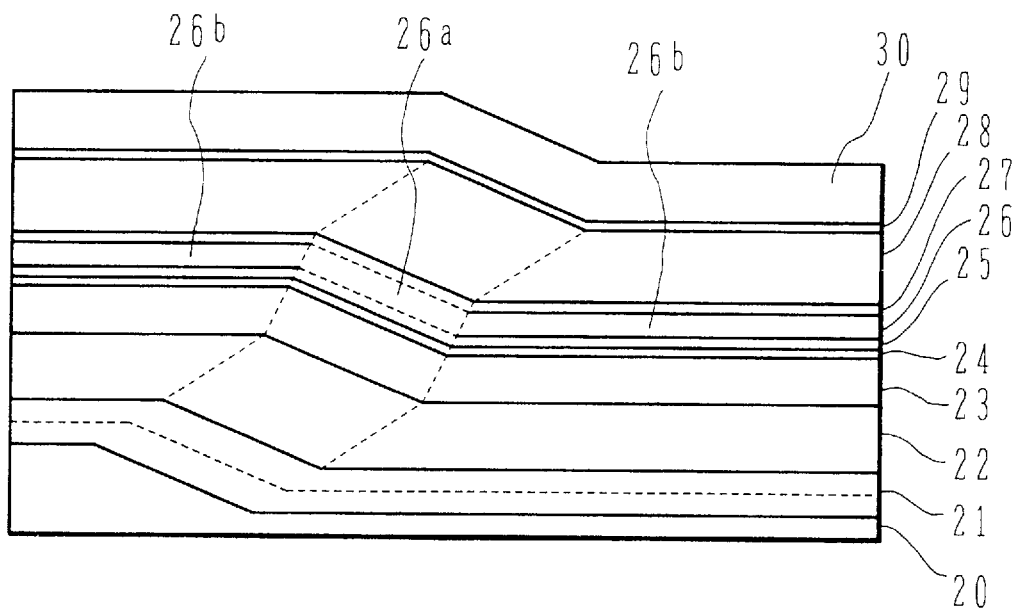
FIG. 8A is a cross sectional view of a semiconductor laser with a light emitting slant plane according to a first embodiment of the invention.

FIG. 8A is a cross sectional view of a semiconductor laser of the first embodiment having the structure discussed above. A method of manufacturing a semiconductor laser of the first embodiment will be described.

An n-type GaAs substrate doped with Si and having a carrier concentration of $4 \times 10^{18}$ $cm^{-3}$ is prepared which has a principal plane with an off-angle of 6° from the (1 0 0) plane toward the (1 1 1) A plane. On the surface of this n-type GaAs substrate, a photoresist pattern is formed extending in the [1 1 $\bar{1}$] direction, the photoresist pattern having stripes each having a width of 150 $\mu$m and the stripes having an interval of 150 $\mu$m.

By using the photoresist pattern as an etching mask, the substrate surface is etched about 0.5 $\mu$m deep by using HF based solution to form a slant plane portion inclined by about 14 degrees relative to the principal surface of the substrate. The slant plane portion has nearly the (4 1 1) A plane. Thereafter, the photoresist pattern is removed. With these processes, an n-type GaAs stepped substrate is formed which has an upper flat plane portion (exposing the surface of the original substrate), a lower flat plane portion, and a slant plane portion connecting the upper and lower flat plane portions.

An n-type buffer layer 21 is formed on the stepped substrate 20 having the slant plane portion. The buffer layer 21 is a two-layer structure of a GaAs layer and a $Ga_{0.5}In_{0.5}P$ layer. First, a GaAs layer is grown 1.5 $\mu$m thick by MOVPE, having an n-type carrier concentration of $5 \times 10^{17}$ $cm^{-3}$. The source gases used are trimethylgallium (TMG) and arsine ($AsH_3$), the dopant is disilane ($Si_2H_6$), the V/III ratio is 100, the growth temperature is 670° C., and the growth speed is 1 $\mu$m/hour.

A growth pressure is 50 torr, the total flow of source gases is 8 slm, the growth efficiency is about 800 $\mu$m/mol, and the carrier gas is hydrogen. These conditions about a growth pressure, the total flow of source gases, the growth efficiency, and the carrier gas are used in common for each layer grown by MOVPE.

Next, while the growth temperature is gently changed from 670° C. to 710° C., an n-type $Ga_{0.5}In_{0.5}P$ layer is grown 0.1 $\mu$m thick, having a carrier concentration of about $1 \times 10^{18}$ $cm^{-3}$. The source gases used are triethylgallium (TEG), trimethylindium (TMI), and phosphine ($PH_3$), the dopant is $Si_2H_6$, the V/III ratio is 500, and the growth speed is 1 $\mu$m/hour.

Next, an n-type $(Al_{0.7}Ga_{0.3})_{0.5}In_{0.5}P$ clad layer 22 is grown 1.5 $\mu$m thick, having a carrier concentration of about $5 \times 10^{17}$ $cm^{-3}$. The source gases used are trimethylaluminum (TMA), TEG, TMI, and $PH_3$, the dopant is $Si_2H_6$, the V/III ratio is 330, the growth temperature is 710° C., and the growth speed is 2 $\mu$m/hour. As seen from the graph shown in FIG. 4, the film thickness ratio R of about 1.3 is obtained under the above conditions, while the slant plane portion of the clad layer 22 gradually moves to the lower flat plane portion.

Next, an n-type $(Al_{0.7}Ga_{0.3})_{0.5}In_{0.5}P$ clad layer 23 is grown 0.5 $\mu$m thick, having a carrier concentration of about $5 \times 10^{17}$ $cm^{-3}$. The V/III ratio of the source gases is 160, and the other conditions are the same as the growth conditions of the n-type $(Al_{0.7}Ga_{0.3})_{0.5}In_{0.5}P$ clad layer 22. At the growth temperature of 710° C. and the V/III ratio of 160, the clad layer 23 grows while boundary planes between the slant plane portion and the flat plane portions become perpendicular to the slant plane.

Figure 8B:
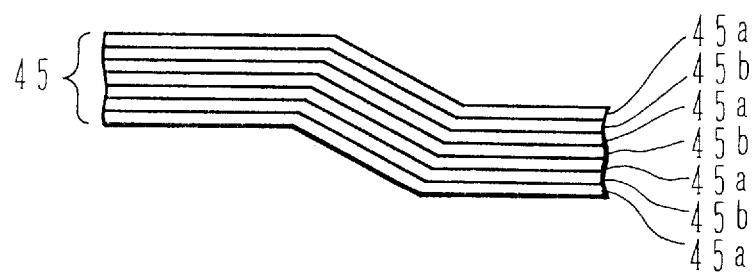
FIG. 8B shows the laminate structure of the MQW active layer of the laser of this embodiment.

Next, an MQW active layer 24 is grown. As shown in FIG. 8B, the MQW active layer 24 has a laminate structure of guide (barrier) layers 45*a* of $(Al_{0.4}Ga_{0.6})_{0.5}In_{0.5}P$ and quantum well layers 45*b* of $Ga_{0.44}In_{0.56}As_{0.08}P_{0.92}$ alternately stacked one upon another. The quantum well layer has about 1% strains. Four guide layer each 5 nm thick are grown, and three quantum well layers each 6 nm thick are grown. The V/III ratio for the guide layer is 400, and that for the quantum well layer is 500. The growth temperature is 710° C. and the growth speed is 1 μm/hour.

Returning back to FIG. 8A, on the active layer 24 a p-type $(Al_{0.7}Ga_{0.3})_{0.5}In_{0.5}P$ clad layer 25 is grown 0.1 μm thick. The source gases used are TMA, TEG, TMI, and PH$_3$, the dopant is dimethylzinc (DMZn), the V/III ratio is 160, the growth temperature is 710° C., and the growth speed is 2 μm/hour. The doping conditions are selected so that the p-type carrier concentration is $6 \times 10^{17}$ cm$^{-3}$ at the slant plane portion and $1 \times 10^{17}$ cm$^{-3}$ at the flat plane portion.

Next, a clad/blocking layer 26 of $(Al_{0.7}Ga_{0.3})_{0.5}In_{0.5}P$ is grown. The source gases used are TMA, TEG, TMI, and PH$_3$, the V/III ratio is 160, the growth temperature is 710° C., and the growth speed is 2 μm/hour. The layer 26 is grown by alternately using DMZn as the p-type dopant and H$_2$S as the n-type dopant, and repeating thirty cycles each 5 nm thick, to obtain the total film thickness of 0.30 μm. The dependency of S doping amount upon crystal orientation is greater than that of Se shown in FIG. 2.

The doping conditions are selected to satisfy the following carrier concentrations. Namely, the p-type carrier concentration of a p-type thin layer at the slant plane portion doped with Zn is about $1.2 \times 10^{18}$ cm$^{-3}$, the p-type carrier concentration at the flat plane portion doped with Zn is about $2 \times 10^{17}$ cm$^{-3}$, the n-type carrier concentration of an n-type thin layer at the slant plane portion doped with S is about $1 \times 10^{17}$ cm$^{-3}$, and the n-type carrier concentration at the flat plane portion doped with S is about $8 \times 10^{17}$ cm$^{-3}$. Therefore, at the flat plane portions, p$^-$-type layers and n$^+$-type layers are laminated, and at the slant plane portion, p$^+$-type layers and n$^-$-type layers are laminated.

Since the Zn concentration of the Zn-doped layer at the slant plane portion is high, Zn diffuses and propagates into the S-doped n$^-$-type layer. Therefore, the p-type carrier concentration at the slant plane portion becomes about $6 \times 10^{17}$ cm$^{-3}$ which is about a half of the carrier concentration before Zn is diffused. Since the n-type carrier concentration of the S-doped n-type thin layer at the slant plane portion is about $1 \times 10^{17}$ cm$^{-3}$, the slant plane portion 26a of the clad/blocking layer 26 becomes a p-type. The flat plane portions 26b of the clad/blocking layer 26 becomes an n-type functioning as a current blocking layer.

Although the clad/blocking layer 26 is formed by alternately doping p- and n-type impurities, it may be formed by doping both p- and n-type impurities at the same time. In this case, p- and n-type impurities are uniformly doped at the flat and slant plane portions, and they are compensated each other to form the flat plane portion of an n-type and the slant plane portions of a p-type. If Cd is used as the p-type impurities instead of Zn, a crystal orientation dependency becomes greater than Zn.

On the clad/blocking layer 26 a p-type $(Al_{0.7}Ga_{0.3})_{0.5}In_{0.5}P$ clad layer 27 is grown 0.1 μm thick. The source gases used are TMA, TEG, TMI, and PH$_3$, the dopant is DMZn, the V/III ratio is 160, the growth temperature is 710° C., and the growth speed is 2 μm/hour. The doping conditions are selected so that the p-type carrier concentration is about $6 \times 10^{17}$ cm$^{-3}$ at the slant plane portion and about $1 \times 10^{17}$ cm$^{-3}$ at the flat plane portion.

At the growth temperature of 710° C. and the V/III ratio of about 160 being set while the clad layers 25 to 27 are formed, boundary planes between the slant plane portion and the flat plane portions become generally perpendicular to the slant plane portion.

On the p-type clad layer 27, a p-type $(Al_{0.7}Ga_{0.3})_{0.5}In_{0.5}P$ clad layer 28 is grown about 1.5 μm thick. The source gases used are TMA, TEG, TMI, and PH$_3$, the dopant is DMZn, the V/III ratio is 330, the growth temperature is 710° C., and the growth speed is 2 μm/hour. Under these growth conditions, since the film thickness ratio R is about 1.3 as seen from the graph shown in FIG. 4, the clad layer 27 grows while gradually moving its slant plane portion toward the lower flat plane portion. The doping conditions are selected so that the p-type carrier concentration becomes higher at the slant plane portion than at the flat plane portions, for example, $6 \times 10^{17}$ cm$^{-3}$ at the slant plane portion and $1 \times 10^{17}$ cm$^{-3}$ at the flat plane portions.

By setting the carrier concentration at the slant plane portion higher than at the flat plane portions, a suitable current path can be formed.

Next, a p-type $Ga_{0.5}In_{0.5}P$ intermediate layer 29 is grown about 0.1 μm while gradually lowering the growth temperature from 710° C. to 670° C. The source gases used are TEG, TMI, and PH$_3$, the dopant is DMZn, the V/III ratio is 500, and the growth speed is 1 μm/hour. The doping conditions are selected so that the p-type carrier concentration becomes $1 \times 10^{18}$ cm$^{-3}$ at the slant plane portion.

Lastly, a p-type GaAs contact layer 30 is formed 5 μm thick, having a p-type carrier concentration of about $2 \times 10^{18}$ cm$^{-3}$ at the slant plane portion. The source gases used are TMG and AsH$_3$, the dopant is DMZn, the V/III ratio is 100, the growth temperature is 670° C., and the growth speed is 1 μm/hour.

After a series of MOVPE processes described above, the semiconductor substrate is taken out of the epitaxy system, and separated into independent devices by forming trenches cutting at least the p-type regions, for example, at a width of 100 μm wide. On the bottom of the GaAs substrate 20, for an n-side electrode a laminate of an Au layer, a Ge layer, and an Au layer is deposited through vapor deposition, and for a p-side electrode a laminate of an AuZn layer and an Au layer is deposited through vapor deposition on the p-type GaAs contact layer 30. Thereafter, the substrate is cleaved into chips having, for example, a width of 300 μm and a length of 700 μm. Each chip is bonded to a heat sink, with the p-type regions disposed upward.

Si is doped in the n-type clad layer so as not to make the n-type concentration at the slant plane portion lower than at the flat plane portions. If Cd is used as the dopant for the p-type clad layer, a resistivity can be lowered further.

The semiconductor laser shown in FIGS. 8A and 8B has the structure that an angle between the slant plane and the boundary planes between the slant and flat plane portions at the clad layers 23, 25, 26, and 27 near the active layer 24, is about 90°. As a result, the polarization direction is generally aligned along the slant plane of the active layer, as described with FIG. 6. In this specification, the angle of "about 90°" is intended to mean an angle in the range from 80 to 100°. It is not necessarily required that the angle between the slant plane and the boundary planes between the slant and flat plane portions is about 90°. The polarization direction is also possible to be set along the active layer slant plane if the angle at a depth region near the active region is set nearer to 90° than at a depth region far from the active region. The clad layers 22 and 28 have the structure that the slant plane portion moves toward the lower flat plane portion as the layers are grown, like the structure described with FIG. 3B. As a result, the radiative area becomes stable and a near field pattern with a single peak can be obtained. The thickness of layers on both sides of the active layer having the structure that the boundary planes between the flat and slant plane portions are generally perpendicular to the slant plane, is preferably 1 μm or thinner.

The upper and lower clad layers 22 and 28 of the semiconductor laser shown in FIGS. 8A and 8B, sandwiching a plurality of layers 23, and 25 to 27 near the active layer 24 having the boundary planes between the flat and slant plane portions perpendicular to the slant plane, are grown at a large V/III ratio so that the slant plane portions of the clad layers 22 and 28 gradually move toward the lower flat plane portions. Contrary, the clad layers may be grown at a small V/III ratio so that the slant plane portions thereof gradually move toward the upper flat plane portions.

Figure 9:
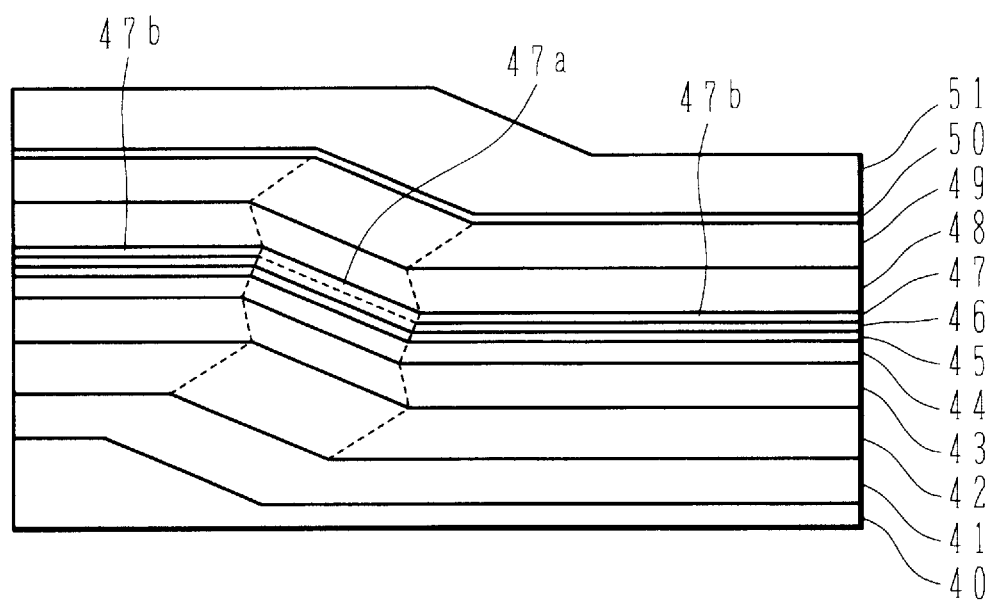
FIG. 9 is a cross sectional view of a semiconductor laser with a light emitting slant plane according to a second embodiment of the invention.

FIG. 9 is a cross sectional view of a semiconductor laser according to the second embodiment of the invention, wherein the upper and lower layers sandwiching the clad layers near the active layer are grown at a small V/III ratio to make the slant plane portions gradually move toward the upper flat plane portions.

An MQW active layer 45 made of a laminate of GaInAsP layers and AlGaInP layers is formed between the upper two layers 46 and 47 and the lower layer 44. The upper layer 46 is a p-type AlGaInP clad layer of 0.2 μm thick, the upper layer 47 is an AlGaInP clad/blocking layer of 0.2 μm thick, the lower layer 44 is an n-type AlGaInP clad layer 44 of 0.4 μm thick. The clad layers 44 and 46 and clad/blocking layer 47 are grown at a V/III ratio of 160 to make the boundary planes between the flat and slant plane portions generally perpendicular to the slant plane. The clad/blocking layer 47 is formed under the conditions that its slant plane portion becomes a p-type and its flat plane portions become an n-type, so that it functions as a current confinement layer.

This laminate structure is further sandwiched between a p-type AlGaInP clad layer 48 of 1 μm thick and an n-type AlGaInP clad layer of 1 μm thick. The clad layers 43 and 48 are grown at a V/III ratio of about 100 so that the slant portions thereof gradually move toward the upper flat plane portions.

This laminate structure from the clad layer 43 to clad layer 48 is further sandwiched between a p-type AlGaInP clad layer 49 and an n-type AlGaInP clad layer 42. The clad layers 42 and 49 are grown at a V/III ratio of 330 so that the slant portions thereof gradually move toward the lower flat plane portions.

This laminate structure from the clad layer 42 to clad layer 49 is formed on an n-type buffer layer 41 grown on an n-type stepped GaAs substrate 40. On the surface of the clad layer 49, a p-type GaInP intermediate layer 50 and a p-type GaAs contact layer 51 are laminated in this order.

As shown in FIG. 9, in the laminate structure from the clad layer 44 to clad/blocking layer 47 near the active layer 45, since the boundary planes between the flat and slant plane portions are made generally perpendicular to the slant plane, it can be considered that the polarization direction is generally along the slant plane of the active layer. Furthermore, since the laminate structure from the clad layer 44 to clad/blocking layer 47 is sandwiched between the clad layers 43 and 48 with the slant plane portions gradually moving toward the upper flat plane portions, carriers concentrate near the center of the active layer so that the radiative area becomes stabilized and the near field patter n with a single peak can be formed.

This structure is, however, associated with a problem of a large pit defect density shown in FIG. 7 because the V/III ratio is smaller than 250 when the clad layers 43 and 48 are grown. In order to suppress the generation of pit defects, it is preferable to sandwich the laminate structure from the clad layer 43 to clad layer 48 between the clad layers 42 and 49 which are grown at a V/III ratio larger than 250.

Semiconductor lasers of the first and second embodiments were manufactured at various V/III ratios when clad layers are grown. From the measurements of light emission characteristics of these lasers, it has been found that there is a correlation between a V/III ratio and a threshold current.

Figure 10:
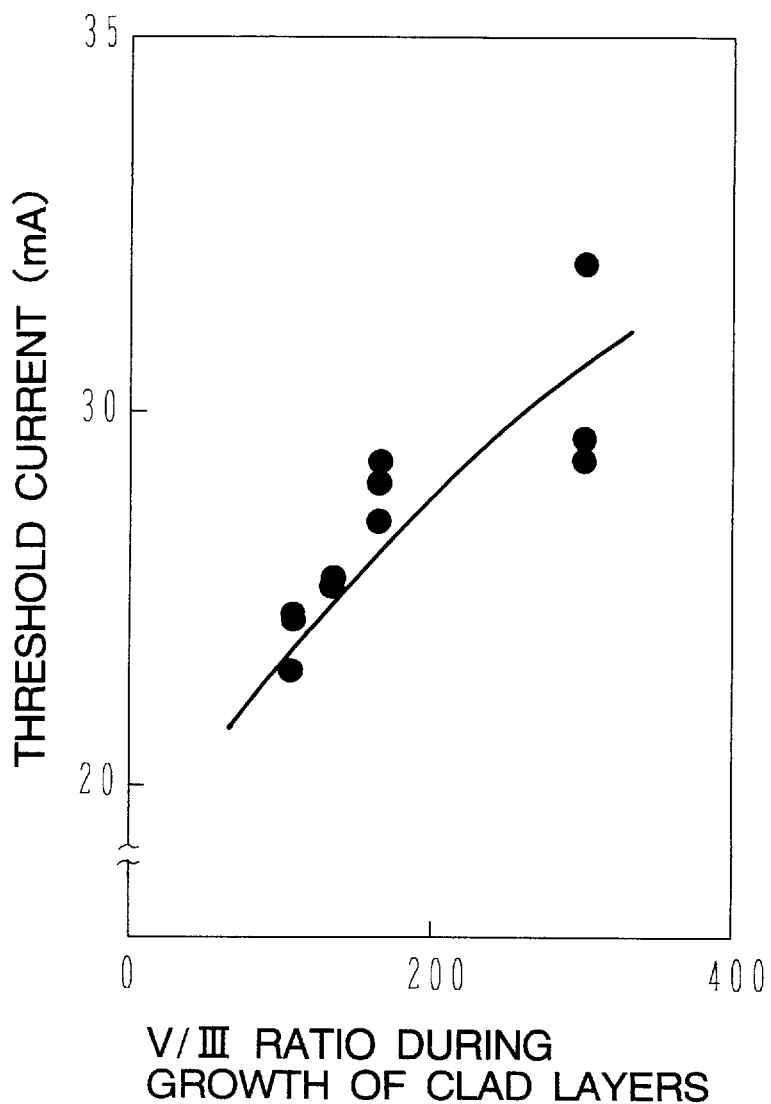
FIG. 10 is a graph showing a dependency of a threshold current upon a V/III ratio.

FIG. 10 illustrates a relationship between a V/III ratio and a threshold current. The abscissa represents a V/III ratio when clad layers are grown, and the ordinate represents a threshold current in the unit of mA. At the V/III ratio of 330 during the growth of clad layers, the threshold current is about 29 to 33 mA, and as the V/III ratio is lowered, the threshold current reduces. As the V/III ratio is lowered to 100, the threshold current reduces to about 23 mA. As seen from FIG. 10, the threshold current can be reduced by lowering the V/III ratio during the growth of clad layers. For example, in order to reduce the threshold current to 30 mA or 25 mA, or smaller, the V/III ratio is set to 250 or 150, or smaller.

Figure 11:
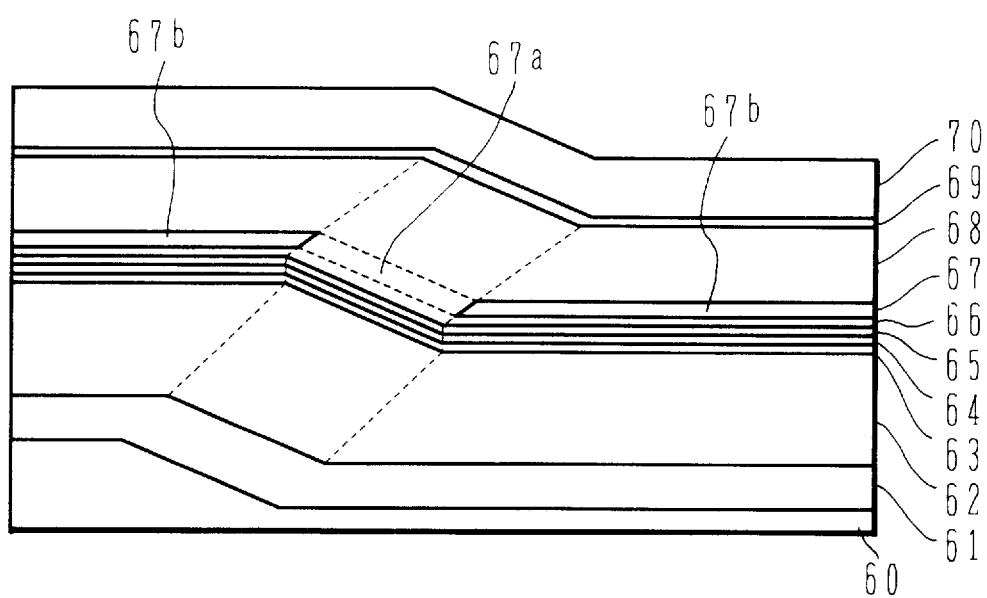
FIG. 11 is a cross sectional view of a semiconductor laser with a light emitting slant plane according to a third embodiment of the invention.

FIG. 11 is a cross sectional view of a semiconductor laser according to the third embodiment, mainly aiming at reducing a threshold current by using a small V/III ratio when clad layers are grown.

A strain MQW active layer 64 made of a laminate of GaInAsP layers and AlGaInP layers is formed between an upper p-type AlGaInP clad layer 65 of 0.1 μm thick and a lower n-type AlGaInP clad layer 63 of 0.1 μm thick. The clad layers 63 and 65 are grown at a V/III ratio of 110 to make the slant plane portions gradually move toward the upper flat plane portions.

This laminate structure from the clad layer 63 to clad layer 65 is further sandwiched between the upper three layers and a lower layer. The upper three layers include a p-type AlGaInP clad layer 66, an AlGaInP clad/blocking layer 67, and a p-type AlGaInP clad layer 68. The lower layer is an n-type AlGaInP clad layer 62. The slant plane portion 67a of the clad/blocking layer 67 is a p-type, and the flat plane portions 67b thereof are an n-type, the clad/blocking layer functioning as a current confinement layer. The clad layers 62, 66, and 68 and clad/blocking layer 67 are grown at a large V/III ratio to make the slant plane portions gradually move toward the lower flat plane portions.

This laminate structure from the clad layer 62 to clad layer 68 is formed on an n-type buffer layer 61 grown on an n-type GaAs stepped substrate 60. On the surface of the clad layer 68, a p-type GaInP intermediate layer 69 and a p-type GaAs contact layer 70 are laminated in this order.

In the semiconductor laser shown in FIG. 11, the clad layers 63 and 65 in direct contact with the active layer are grown at a V/III ratio of 110. It is therefore expected that the threshold current can be reduced to about 23 mA as seen from FIG. 10. However, since the boundary planes between the flat and slant plane portions are not perpendicular to the slant plane, at the clad layers 63 and 65 near the active layer, there is a possibility of an inclination of the polarization direction from the slant plane of the active layer 64.

If the clad layers 63 and 65 are made thin, it can be considered that the polarization direction is influenced more by the outer clad layers than the inner clad layers 63 and 65. The clad layers 63 and 65 rotate the polarization direction in one direction, whereas the outer clad layers 62, and 66 to 68 rotate the polarization direction in the reverse direction. Therefore, by adjusting the thicknesses of the clad layers 63 and 65 and an inclination of boundary planes between the flat and slant plane portions at each clad layer, it can be expected that the functions of rotating the polarization direction can be cancelled out and the polarization direction can be set along the slant plane of the active layer. In order to sufficiently cancel out the functions of rotating the polarization direction, the preferable thicknesses of the clad layers are supposed to be 0.2 μm or thinner.

If a semiconductor laser is used for technical fields not depending upon the polarization direction, its threshold current can be reduced by using as small a V/III ratio as possible when the clad layers 63 and 65 are grown.

Next, a semiconductor laser of the fourth embodiment will be described with reference to FIG. 12.

The inventor found strains generated near the boundary area between the flat and slant plane portions when the cross sections of semiconductor laser having the structure shown in FIG. 3B was observed with a transmission type electron microscope (TEM). One of the reasons of rotating the polarization direction may be ascribed to these strains. It has been found that the polarization direction rotates in a direction perpendicular to a direction along which strains extend. It can be presumed that if a strain layer is intentionally formed in parallel to the active layer, the influence by strains near the boundary area between the flat and slant plane portions can be reduced relatively.

Figure 12:
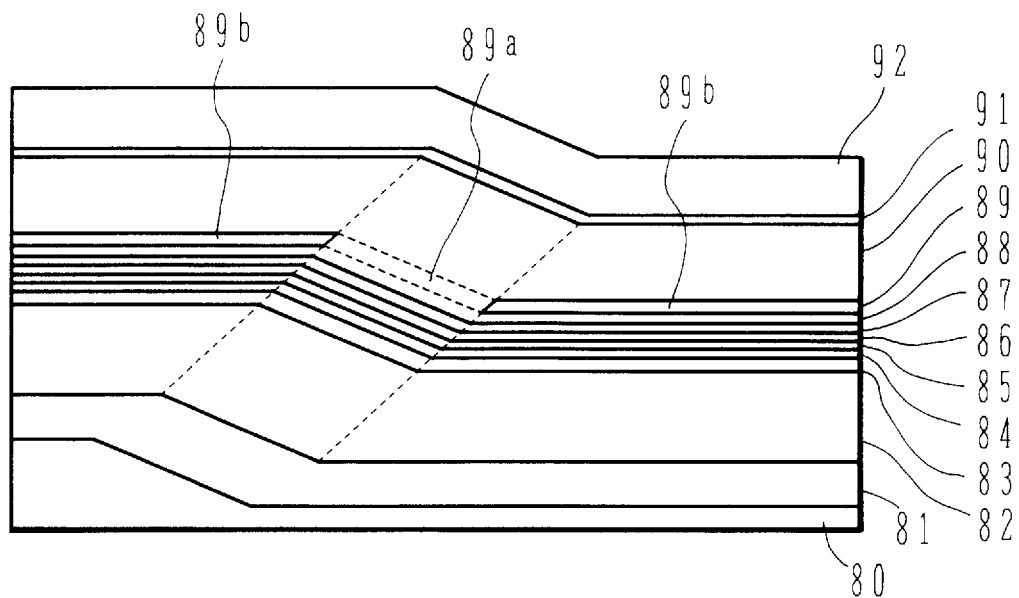
FIG. 12 is a cross sectional view of a semiconductor laser with a light emitting slant plane according to a fourth embodiment of the invention.

FIG. 12 is a cross sectional view of a semiconductor laser of the fourth embodiment having a strain layer in parallel to the active layer. A strain MQW active layer 85 made of a laminate of GaInAsP layers and AlGaInP layers is formed between an upper p-type AlGaInP strain clad layer 86 of 50 nm thick and a lower n-type AlGaInP strain clad layer 84 of 50 nm thick. This laminate structure is sandwiched between an upper p-type AlGaInP strain clad layer 87 of 50 nm thick and a lower n-type AlGaInP strain clad layer 83 of 50 nm thick.

This laminate structure from the clad layer 83 to clad layer 87 is formed on an n-type AlGaInP clad layer 82. The clad layer 82 is formed on an n-type buffer layer 81 grown on an n-type GaAs stepped substrate 81.

The clad layer 82 was grown to a thickness of 1.5 μm under the conditions of the source gases of TMA, TEG, TMI, and PH$_3$, the growth temperature of 710° C., the V/III ratio of 400, and the growth speed of 2 μm/hour. Si$_2$H$_6$ was used as the dopant, and the n-type carrier concentration was set to 5×10$^{17}$ cm$^{-3}$.

The In composition of the clad layers 83 and 87 is set more than that of the clad layer 82 to generate 0.3% of contraction strains. The In composition of the clad layers 84 and 86 is set less than that of the clad layer 82 to generate 0.3% of extension strains.

On the clad layer 87, a p-type AlGaInP clad layer 88, an AlGaInP clad/blocking layer 89, and a p-type AlGaInP clad layer 90 are formed in this order. The clad layers 88 and 90 and clad/blocking layer 89 are lattice-matched with an n-type GaAs buffer layer 81, and no strain is generated in these layers. The clad/blocking layer 89 is formed by alternately doping Zn and S to form a p-type at the slant plane portion 89a and an n-type at the flat plane portions 89b.

On the surface of the clad layer 90, a p-type GaInP intermediate layer 91 and a p-type GaAs contact layer 92 are laminated in this order.

Insertion of the strain clad layers 83, 84, 86, and 87 as the upper and lower layers of the active layer 85 can reduce an off-angle of the polarization direction from the slant plane. A change in the refractive index of the strain clad layers 83, 84, 86, and 87 is negligible as compared to clad layers without strain. Therefore, a light distribution can be considered to be hardly influenced, because of the insertion of these strain clad layers.

A relatively thick strain layer can be formed without increasing the total amount of strains by alternately laminating layers with extension strains and layers with contraction strains. It is preferable to set the strain amount to 0.1% or more in order to obtain the effects of reducing the off-angle of the polarization direction from the slant plane.

Figure 13:
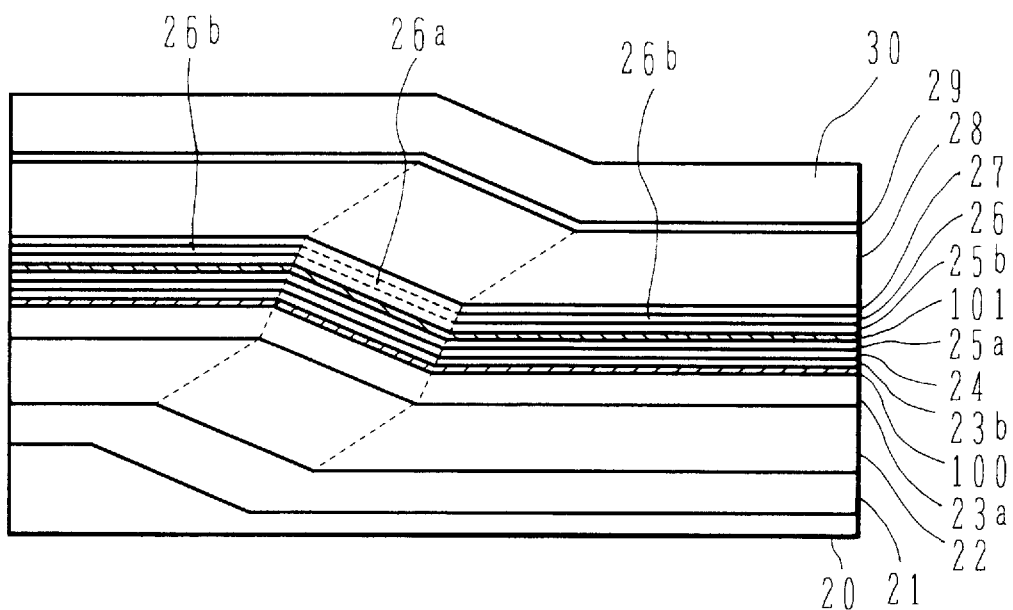
FIG. 13 is a cross sectional view of a semiconductor laser with a light emitting slant plane according to a fifth embodiment of the invention.

FIG. 13 is a cross sectional view of a semiconductor laser of the fifth embodiment which is a combination of the fourth embodiment and the first embodiment shown in FIG. 8A.

The clad layer 23 shown in FIG. 8A is separated into clad layers 23a and 23b between which an n-type AlGaInP strain clad layer 100 is inserted. The clad layer 25 shown in FIG. 8A is separated into clad layers 25a and 25b between which a p-type AlGaInP strain layer 101 is inserted. The other structures are the same as the semiconductor laser shown in FIG. 8A. The clad layers 100 and 101 have, for example, 0.5% extension strains.

The fifth embodiment which is a combination of the first and fourth embodiments is considered to be able to reduce an off-angle of the polarization direction from the slant plane. Similar advantages can also be expected for a combination of the fourth embodiment, and the second embodiment shown in FIG. 9 or the third embodiment shown in FIG. 11.

The GaAs stepped substrate used in the above embodiments has the flat plane with an off-angle of 6° from the (1 0 0) plane toward the (1 1 1) A plane, and the slant plane of the (4 1 1) A plane. Other planes having different impurity doping probabilities may be used. For example, a stepped substrate may be used which has the (1 0 0) plane or (n 1 1) A plane (7<n, n is a real number) as the flat plane and the (n' 1 1) A plane (2≦n'≦7, n' is a real number) as the slant plane. If group III-V compound semiconductor is epitaxially grown on a stepped substrate having the (n' 1 1) A plane (2≦n'≦7, n' is a real number) as the slant plane, the (n" 1 1) A plane (3≦n"≦7, n" is a real number) appears on the grown surface at the slant plane portion.

In the above embodiments, the angle between the boundary planes, between the flat and slant plane portions, and the slant plane is controlled for both the upper and lower clad layers of the active layer. The angle may be controlled only for one of the upper and lower sides. The strain clad layer may be inserted between the clad layers of only one of the upper and lower sides.

Also in the above embodiments, the angle between the boundary planes, between the flat and slant plane portions, and the slant plane, has been described without discriminating between the upper and lower flat plane portions. If the angles relative to the upper and lower flat plane portions are different, the angle relative to one of the upper and lower flat plane portions may be controlled, or the average angle of the angles relative to both the upper and lower flat plane portions may be controlled.

In the above embodiments, an AlGaInP/GaAs based semiconductor laser is used. Other group III-V compound semiconductor lasers are also considered to have similar phenomena described above, and so the invention is also applicable to those lasers.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A semiconductor laser comprising:

a first lower clad layer;

a second lower clad layer, formed over said first lower clad layer;

an active layer, formed over said second lower clad layer;

a first upper clad layer, formed over said active layer; and a second upper clad layer, formed over said first upper clad layer; wherein each of said first lower clad layer, said second lower clad layer, said active layer, said first upper clad layer, and said second upper clad layer has upper and lower surfaces, each of said upper and lower surfaces including an upper flat surface, a lower flat surface and a slanted surface coupling the upper flat surface with the lower flat surface, the upper flat surfaces and the lower flat surfaces are parallel to each other, the slanted surfaces are parallel to each other, edges formed between said upper flat surfaces and slanted surfaces of said upper and lower surfaces of said first lower clad layer lie in a first virtual plane, edges formed between said lower flat surfaces and slanted surfaces of said upper and lower surfaces of said first lower clad layer lie in a second virtual plane, edges formed between said upper flat surfaces and slanted surfaces of said upper and lower surfaces of said second lower clad layer lie in a third virtual plane, edges formed between said lower flat surfaces and slanted surfaces of said upper and lower surfaces of said second lower clad layer lie in a fourth virtual plane, edges formed between said upper flat surfaces and slanted surfaces of said upper and lower surfaces of said first upper clad layer lie in a fifth virtual plane, edges formed between said lower flat surfaces and slanted surfaces of said upper and lower surfaces of said first upper clad layer lie in a sixth virtual plane, edges formed between said upper flat surfaces and slanted surfaces of said upper and lower surfaces of said second upper clad layer lie in a seventh virtual plane, edges formed between said lower flat surfaces and slanted surfaces of said upper and lower surfaces of said second upper clad layer lie in a eighth virtual plane, and a pair of two planes selected from a group consisting of a pair of said first and third virtual planes, a pair of said second and fourth virtual planes, a pair of said fifth and seventh virtual planes, and a pair of said sixth and eighth virtual planes, are not parallel to each other.

2. The semiconductor laser of claim 1, further comprising a stepped substrate upon which said first lower clad layer is formed.

3. The semiconductor laser of claim 2, wherein said stepped substrate, said first lower clad layer, said second lower clad layer, said first upper clad layer and said second upper clad layer are formed of a group III-V compound.

4. The semiconductor layer of claim 3 wherein, the flat surfaces have a (1 0 0) plane or an (n 1 1) A plane, where n is a real number less than 7, and the slanted surfaces have an (m 1 1) A plane, where m is a real number greater or equal to 2 and less than or equal to 7.

5. The semiconductor layer of claim 1 wherein, the flat surfaces have a (1 0 0) plane or an (n 1 1) A plane, where n is a real number less than 7, and the slanted surfaces have an (m 1 1) A plane, where m is a real number greater or equal to 2 and less than or equal to 7.

6. A semiconductor laser according to claim 1, wherein an angle θ between at least one of said third, fourth, fifth and sixth virtual planes and a plane parallel to the slanted surfaces is generally 90 degrees.

7. A semiconductor laser according to claim 1, wherein an average angle of an angle between said third virtual plane and a plane parallel to the slanted surfaces and an angle between said fourth virtual plane and a plane parallel to the slanted surfaces or an average of an angle between said fifth virtual plane and a plane parallel to the slanted surfaces and an angle between said sixth virtual plane and a plane parallel to the slanted surfaces is generally 90 degrees, all of said angles measured in the same direction from the corresponding plane parallel to the slanted surfaces.

8. A semiconductor laser according to claim 1, wherein a thickness of said second upper clad layer or said first lower clad layer is 1 $\mu$m or thinner.

9. A semiconductor laser according to claim 1, wherein an angle between at least one of said third, fourth, fifth and sixth virtual planes and a plane parallel to the slanted surfaces measured in a first direction from the plane parallel to the slanted surfaces, is larger than an angle between at least one of said first, second, seventh and eighth virtual planes and a plane parallel to the slanted surfaces, measured in the first direction from the plane parallel to the slanted surfaces.

10. A semiconductor laser according to claim 1, wherein an angle θ between at least one of said third, fourth, fifth and sixth virtual planes and a plane parallel to the slanted surfaces measured in a first direction from the plane parallel to the slanted surfaces is larger than 90 degrees, and an angle between at least one of said first, second, seventh and eighth virtual planes and a plane parallel to the slanted surfaces, measured in the first direction from the plane parallel to the slanted surfaces is smaller than 90 degrees.

11. A semiconductor laser according to claim 10, wherein a thickness of said second upper clad layer or said first lower clad layer is 0.2 $\mu$m or thinner.

12. A semiconductor laser according to claim 1, wherein at least one of said second upper clad layer or said first lower clad layer includes one or more strain layers disposed in parallel to said active layer, said strain layer containing strains.

13. A semiconductor laser according to claim 12, wherein the absolute amount of strains in said one or more strain layers is 0.1% or more.

14. A semiconductor laser according to claim 12, wherein said strain layers is a laminate of a layer containing tensile strains and a layer containing compressive strains.

15. The semiconductor layer of claim 12, wherein said one or more strain layers contain a greater absolute amount of strains than a separate layer of said upper or lower clad layer.

16. A semiconductor laser comprising:

a first lower clad layer;

a second lower clad layer, formed over said first lower clad layer;

an active layer, formed over said second lower clad layer; and a first upper clad layer, formed over said active layer; wherein each of said first lower clad layer, said second lower clad layer, said active layer, and said first upper clad layer, has upper and lower surfaces, each of said upper and lower surfaces including an upper flat surface, a lower flat surface and a slanted surface coupling the upper flat surface with the lower flat surface, the upper flat surfaces and the lower flat surfaces are parallel to each other, the slanted surfaces are parallel to each other, edges formed between said upper flat surfaces and slanted surfaces of said upper and lower surfaces of said first lower clad layer lie in a first virtual plane, edges formed between said lower flat surfaces and slanted surfaces of said upper and lower surfaces of said first lower clad layer lie in a second virtual plane, edges formed between said upper flat surfaces and slanted surfaces of said upper and lower surfaces of said second lower clad layer lie in a third virtual plane, edges formed between said lower flat surfaces and slanted surfaces of said upper and lower surfaces of said second lower clad layer lie in a fourth virtual plane, and a pair of two planes selected from a group consisting of a pair of said first and third virtual planes, and a pair of said second and fourth virtual planes are not parallel to each other.

17. A semiconductor laser comprising:

a first lower clad layer;

an active layer, formed over said first lower clad layer;

a first upper clad layer, formed over said active layer; and a second upper clad layer, formed over said first upper clad layer; wherein each of said first lower clad layer, said active layer, said first upper clad layer, and said second upper clad layer has upper and lower surfaces, each of said upper and lower surfaces including an upper flat surface, a lower flat surface and a slanted surface coupling the upper flat surface with the lower flat surface, the upper flat surfaces and the lower flat surfaces are parallel to each other, the slanted surfaces are parallel to each other, edges formed between said upper flat surfaces and slanted surfaces of said upper and lower surfaces of said first upper clad layer lie in a first virtual plane, edges formed between said lower flat surfaces and slanted surfaces of said upper and lower surfaces of said first upper clad layer lie in a second virtual plane, edges formed between said upper flat surfaces and slanted surfaces of said upper and lower surfaces of said second upper clad layer lie in a third virtual plane, edges formed between said lower flat surfaces and slanted surfaces of said upper and lower surfaces of said second upper clad layer lie in a fourth virtual plane, and a pair of two planes selected from a group consisting of a pair of said first and third virtual planes, and a pair of said second and fourth virtual planes are not parallel to each other.

* * * * *